United States Patent
Bogholtz, Jr. et al.

[11] Patent Number: 5,357,523
[45] Date of Patent: Oct. 18, 1994

[54] MEMORY TESTING SYSTEM WITH ALGORITHMIC TEST DATA GENERATION

[75] Inventors: Richard Bogholtz, Jr., Mahopac; Louis J. Bosch, Hopewell Junction; Kevin C. Gower, Wappingers Falls; Thomas Mitchell, Cornwall, all of N.Y.

[73] Assignee: International Business Machines Corporation, Armonk, N.Y.

[21] Appl. No.: 810,007

[22] Filed: Dec. 18, 1991

[51] Int. Cl.$^5$ .................. G01R 31/28; G06F 11/00
[52] U.S. Cl. ........................ 371/27; 371/15.1; 371/21.1
[58] Field of Search .............. 371/29, 3, 4, 15.1, 371/16.1, 17, 22.3, 25.1, 71, 24, 2.2, 10.1, 21.1, 10.3, 10.2, 20.4, 21.2, 20.2; 395/275, 425, 200, 325; 364/717, 716, 231.8, 239.5, 241.9, 284.4, 260; 340/825.01, 825.06

[56] References Cited

U.S. PATENT DOCUMENTS

| | | | |
|---|---|---|---|
| 4,216,374 | 8/1980 | Lam et al. | 371/27 |
| 4,222,514 | 9/1980 | Bass | 371/27 |
| 4,654,849 | 3/1987 | White et al. | 371/21 |
| 4,672,307 | 6/1987 | Breuer et al. | 371/27 |
| 4,745,355 | 5/1988 | Eichelberger et al. | 324/73 |
| 4,782,487 | 11/1988 | Smelser | 371/21 |
| 4,860,291 | 8/1989 | Damm et al. | 371/27 |
| 4,870,346 | 9/1989 | Mydill et al. | 334/73 R |
| 4,959,832 | 9/1990 | Bardell | 371/27 |
| 4,980,888 | 12/1990 | Bruce et al. | 371/21.1 |
| 4,989,209 | 1/1991 | Littlebury et al. | 371/22.1 |

FOREIGN PATENT DOCUMENTS 0254017  1/1988  European Pat. Off. .

OTHER PUBLICATIONS

Paul H. Bardell, Jr. & William H. Meanney; Built-in Test for RAMS, Aug. 1988, pp. 29–37 (IBM Corp.).

IBM Journal of Resaearch and Development, vol. 34, No. 2/3, Mar./May 1990, pp. 260–275, by C. W. Rodriguez, et al., entitled "The development of ultra-high-frequency VLSI device test systems".

International Test Conference 1989 Proceedings, 29 Aug. 1989, Washington, D.C., pp. 558–566, by S. Kikuchi, et al., entitled "A 250 MHz shared-resource VLSI test system with high pin count and memory test capability".

Paper on Algebraic Code Theory, Hamming Codes Revisited, Sec. 11.3, Ch. 10, Shannon's Main Theorem.

*Primary Examiner*—Robert W. Beausoliel, Jr.
*Assistant Examiner*—Dieu-Minh Le
*Attorney, Agent, or Firm*—Richard Lau

[57] ABSTRACT

A system for providing test data for testing a semiconductor memory includes generation means for successively developing generated data patterns beginning from a seed data pattern, such that every distinct data pattern of the seed data pattern is successively developed in a forward sequence and, subsequently, the distinct data patterns are successively developed in a reverse sequence relative to the forward sequence.

7 Claims, 8 Drawing Sheets

|  | BIT 3 | BIT 2 | BIT 1 | BIT 0 |
|---|---|---|---|---|
| SEED | 0 | 0 | 0 | 1 |
|  | 0 | 0 | 1 | 0 |
|  | 0 | 1 | 0 | 0 |
|  | 1 | 0 | 0 | 0 |
|  | 0 | 0 | 1 | 1 |
|  | 0 | 1 | 1 | 0 |
|  | 1 | 1 | 0 | 0 |
|  | 1 | 0 | 1 | 1 |
|  | 0 | 1 | 0 | 1 |
|  | 1 | 0 | 1 | 0 |
|  | 0 | 1 | 1 | 1 |
|  | 1 | 1 | 1 | 0 |
|  | 1 | 1 | 1 | 1 |
|  | 1 | 1 | 0 | 1 |
|  | 1 | 0 | 0 | 1 |

MEMORY TESTING SYSTEM WITH ALGORITHMIC TEST DATA GENERATION

TECHNICAL FIELD

The present invention relates generally to memories of digital computers, particularly, to the testing of memories of digital computers and, even more particularly, to the developing of test data for the testing of memories of digital computers.

BACKGROUND OF THE INVENTION

Memory testing systems implementing so-called "intelligence per-pin" architecture generally include a plurality of channels. Each channel corresponds and connects to one input of a device under test (DUT). Thus, the number of channels included in a per-pin memory testing system is at least equal to the number of inputs being used during the testing of the DUT. Typically, all channels in an intelligence per-pin testing system operate simultaneously during a test so as to form a parallel pipelined configuration. Per-pin testing systems are desirable because such systems allow for high speed testing and increased flexibility in configuring and generating test data as required for various testing schemes.

Generally, each channel in a per-pin testing system has a memory which stores input data signals, command signals and control signals appropriate for testing the DUT. Each channel also stores a series of address pattern sequences for presenting to the DUT during a test. Unfortunately, a typical channel memory has limited storage capacity which is incapable of storing all address and input data pattern combinations required for presenting to the DUT.

A solution to this problem is to implement an algorithmic address generator which develops address sequences algorithmically. Such a solution would allow for input data signals, command signals and control signals to be applied to the various addresses of the DUT while only one copy of each signal need be stored in channel memory.

In a strictly per-pin type architecture, one algorithmic address generator would be required for each channel. Since the algorithmic address generator generally resides on the same chip as the channel, the generator typically requires minimal central control, thus allowing for high speed address generation. However, having one address generator per each channel results in problems of increased power consumption by the address generators, and increased physical space requirements for packaging of the address generators. Consequently, the capabilities of the address generator may need to be compromised for reducing power consumption, and for reducing the physical size of the address generator for packaging.

Although an alternate approach of implementing a single address generator in common for all channels of the testing system may solve problems of power consumption and space requirements, such a scheme would severely limit address sequencing capabilities of the testing system. Moreover, a testing system having a single algorithmic address generator in common for all channels would require longer control lines for connecting the address generator to the various channels. Longer control lines cause various testing problems during, such as undesirable signal skew to the DUT and increased line delay times.

Summary of the Invention

It is therefore an object of the present invention to provide a memory testing system capable of generating test data at high speeds for presenting to a device under test.

It is another object of the present invention to provide a memory testing system which is programmable and allows for flexibility in configuring and generating test data for presenting to a device under test.

It is yet a further object of the invention to provide a memory testing system which solves problems of packaging and increased power consumption associated with some testing systems.

It is still another object of the present invention to provide a memory testing system which minimizes or eliminates the problems of signal skew and increased line delay times introduced by some testing systems.

In order to accomplish the above and other objects, the present invention provides a memory testing system, for testing a semiconductor memory having a plurality of input pins, which comprises control means for supplying control signals; at least one prechannel for developing test data in a predetermined manner responsive to the control signals; and a plurality of channels, each channel receiving test data from the prechannels, and each channel providing the test data to the input pins. Each prechannel provides test data to at least two channels such that each prechannel is in close proximity to the channels to which it is connected.

More specifically, each prechannel may comprise start means for providing a seed data pattern in response to a control signal; configuration means for providing a desired configuration; generation means for developing generated data patterns beginning from the seed data pattern in accordance with a predetermined algorithm specified by the desired configuration in response to another control signal; and selection means for successively selecting data from the seed data pattern and each of the generated data patterns, according to the desired configuration, for developing test data.

BRIEF DESCRIPTION OF THE DRAWINGS

These and other objects, features, aspects and advantages will be more readily apparent and better understood from the following detailed description of the invention, in which.

DETAILED DESCRIPTION OF THE PREFERRED EMBODIMENT

Figure 1:
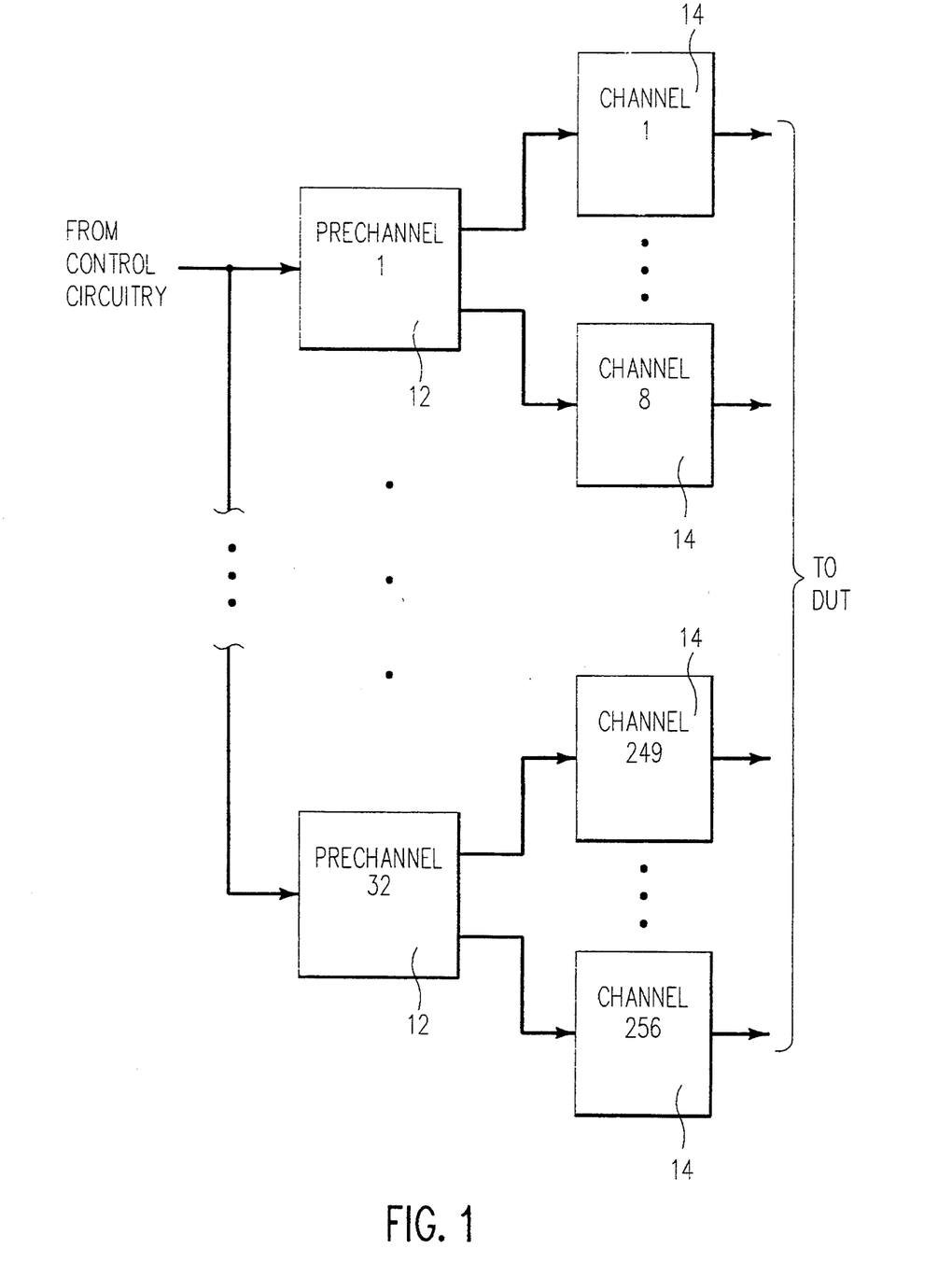
FIG. 1 is an electrical diagram in block form illustrating prechannels and channels connected in accordance with the present invention.

Referring initially to FIG. 1, there is shown a broad overview of the invention which includes a plurality of prechannels 12 and a plurality of channels 14. Illustratively, 32 prechannels 12 are shown with each being connected to eight channels 14, so that there are 256 channels 14 in total. Although the present invention functions adequately with as many as approximately eight channels 14 connected to each prechannel 12, the invention can be practiced with fewer or greater than eight channels 14 connected to each prechannel 12. Moreover, there can also be fewer or greater than 32 prechannels 12 employed in a testing system. In this regard, the quantity or number of prechannels 12 employed depends on the total quantity or number of channels 14 connected to each prechannel 12. However, it should be understood that although there must be an adequate number of prechannels 12 implemented for allowing the testing system to conduct required tests with maximum speed and efficiency, the total number of prechannels 12 utilized should be restricted to the extent that each prechannel 12 should be connected and packaged in relatively close proximity to the channels 14 corresponding thereto. Such close proximity is particularly desirable for limiting the length of control lines connecting each prechannel 12 to its corresponding channels 14, for minimizing or eliminating potential problems, such as signal skew and line delay problems, that may develop during testing.

Generally, the prechannels 12 are programmed or loaded with configuration data provided by control circuitry (not shown). The configuration data programs the prechannels 12 appropriately for and in accordance with the architecture of the device under test (DUT) and the requirements of the test being conducted. The control circuitry also provides the prechannels 12 with control signals, such as load and execute control signals. The prechannels 12 respond to these control signals by developing test data, which may be input data and/or address data signals, in a predetermined sequence according to the configuration data. The test data is then provided to the channels 14 which provide appropriate formatting, timing and shaping of the test data for applying to the DUT, which may be for instance a memory card. Each channel 14 electrically communicates with an input, such as a bidirectional pin, of a DUT so that the channel 14 can apply the test data thereto. Thus, there are at least as many channels 14 as there are input pins used during the testing of the DUT.

Figure 2:
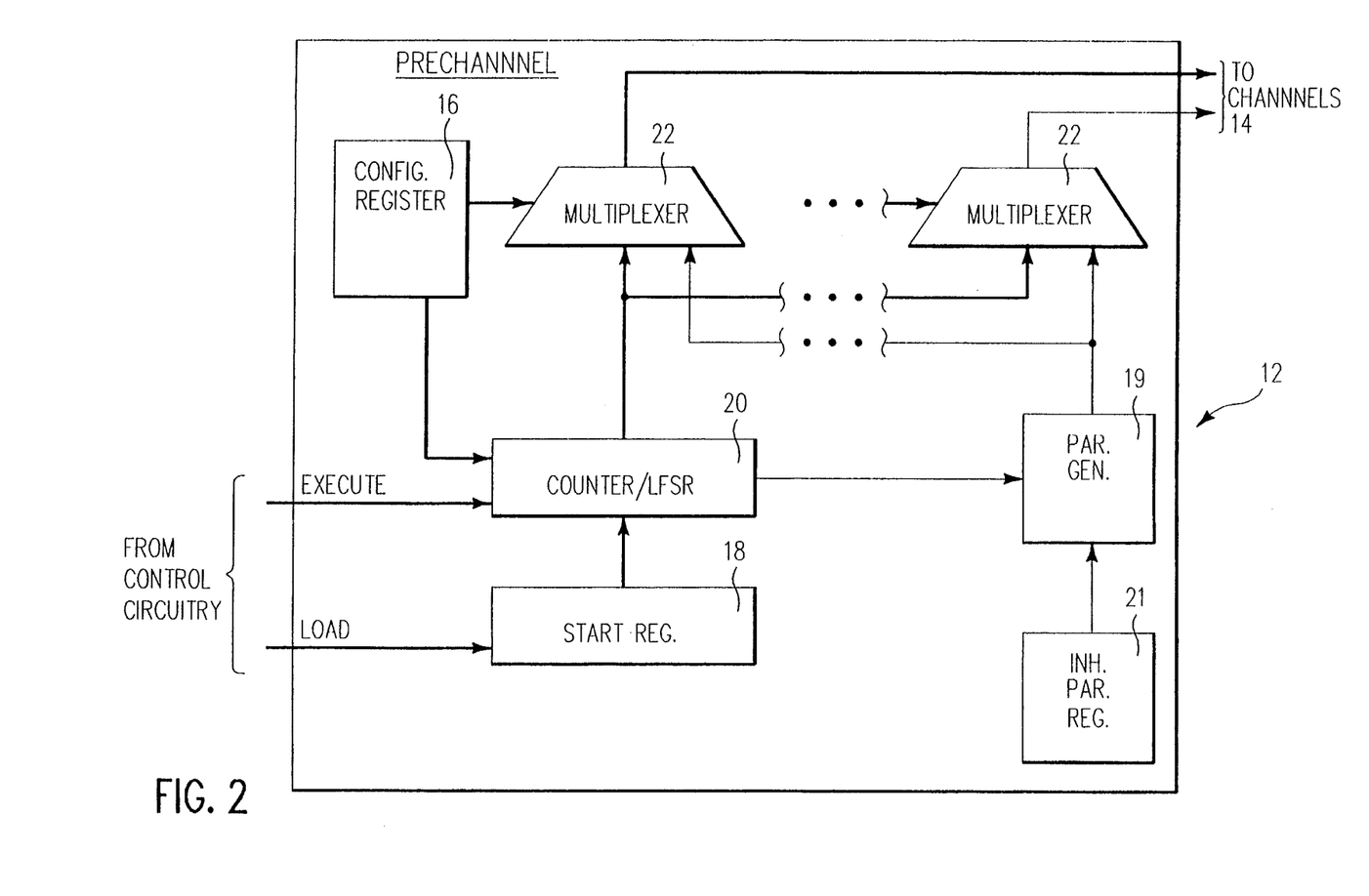
FIG. 2 is an electrical diagram of a prechannel in accordance with the invention.

Referring now to FIG. 2, each prechannel 12 is shown to include a start register 18, a counter/LFSR (linear feedback shift register) 20, a configuration register 16, prechannel multiplexers 22, a parity generator 19, and an inhibit parity register 21. There are at least as many prechannel multiplexers 22 included in each prechannel 12 as there are channels 14 connected to the prechannel 12.

The control circuitry loads the configuration register 16 with configuration data, and loads the start register 18 with a "seed" data pattern. The seed data pattern is the starting point from where a testing sequence is initiated.

The start register 18 responds to a load control signal by loading the seed data pattern into the counter/LFSR 20. The seed data pattern is then passed in parallel from the counter/LFSR 20 to each of the prechannel multiplexers 22. The prechannel multiplexers 22 select which bit(s), if any, of the seed data pattern should be provided as test data to a corresponding channel 14 for applying to the DUT. Specification as to which bit(s) the prechannel multiplexer 22 should select is provided by the configuration data stored in the configuration register 16.

In response to an execute control signal, the counter/LFSR 20 alters the seed data pattern in accordance with a predetermined algorithm as specified by the configuration data stored in the configuration register 16 so as to form a generated data pattern. The generated data pattern is then passed in parallel to the prechannel multiplexers 22 which select the bit(s) for providing as test data to a corresponding channel 14. The corresponding channel 14 then applies the test data to the DUT.

Subsequent execute control signals initiate similar response. That is, the counter/LFSR 20 sequentially alters the generated data pattern contained therein in accordance with the predetermined algorithm; and the successive generated data patterns are passed to the prechannel multiplexers 22 for selection of the bit(s) to use as test data for applying to the DUT via the channels 14. Thus, it can be seen that development of the generated data patterns begins from the seed data pattern and sequentially proceeds therefrom.

The parity generator 19 also receives the seed data pattern and each of the generated data patterns from the counter/LFSR 20, and determines the parity of such data patterns. This parity information is then provided to the DUT, via the prechannel multiplexers 22 and channels 14, as may be required for testing the DUT. Typically, parity is used for error detection in address pattern generation and transmission, and particularly, parity can be used to generate error correction code words, physical addresses and physical data for presenting to the DUT to run tests requiring such information.

The inhibit parity register 21 is programmed or loaded with an inhibit parity data pattern provided by the control circuitry to specify which bit(s) of the data pattern contained in the counter/LFSR 20 should be excluded and which should be included during parity generation. Specification as to which bit(s) should be excluded or included depends on the requirements of the test being conducted and the DUT.

The counter/LFSR 20 is capable of functioning as a counter (up or down), data rotating means (left or right), or a linear feedback shift register (LFSR). The data stored in the configuration register 16 specifies to the counter/LFSR 20 which function should be executed. When functioning as a counter, the counter/LFSR 20 responds to an execute control signal by counting or successively stepping up or down from the current data pattern, seed or generated, contained therein. Since counters are conventional in the electrical arts, implementation and circuitry of the counter/LFSR 20 when functioning as a counter will not be specifically detailed herein.

Generally, LFSRs include a series of chained data storage cells. Data from a storage cell is shifted to the next storage cell, and the output signal from one or more of the storage cells is fed back to preceding storage cells. Typically, the feedback connections and/or shifting is implemented through EXCLUSIVE OR gates. As a result of the feedback arrangement, the sequence of data patterns that the storage cells exhibit is made to be different. Accordingly, particular feedback arrangements can be implemented for cycling through specific sequentially shifting data patterns.

Figure 3:
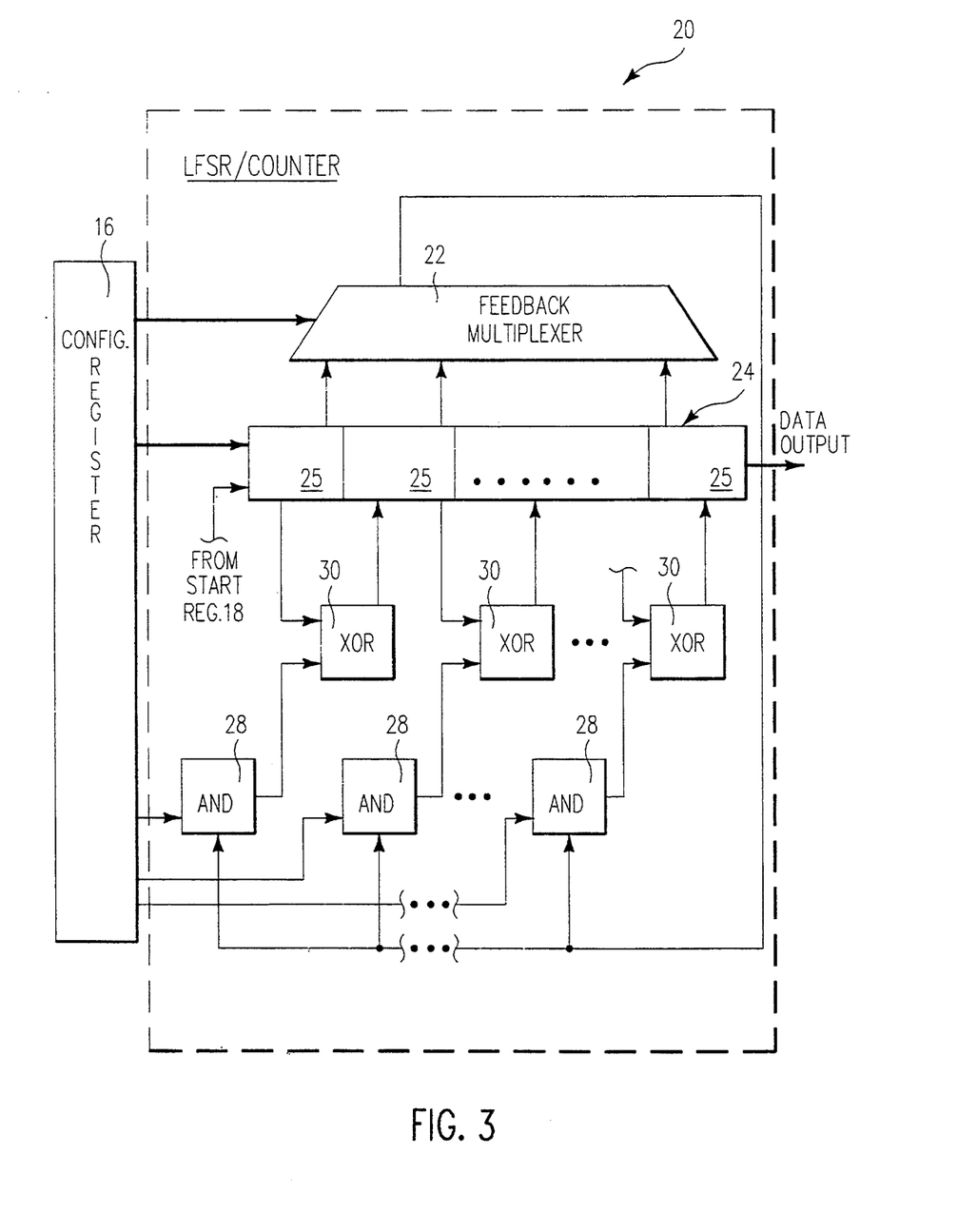
FIG. 3 and FIG. 4 are electrical diagrams of the counter/LFSR in accordance with the invention.
Figure 4:
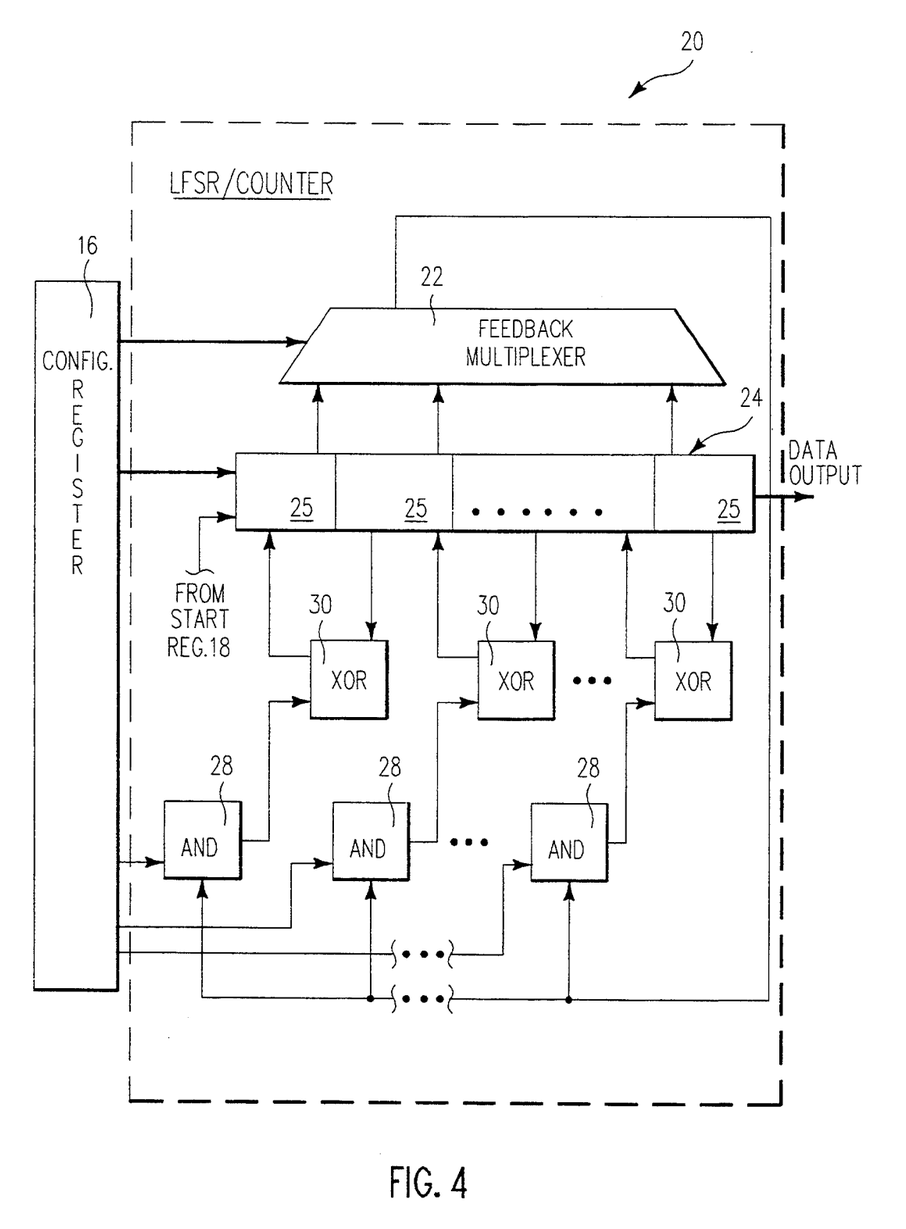

When functioning as a linear feedback shift register, the counter/LFSR 20 is capable of executing in a shift right mode or shift left mode. FIG. 3 illustrates the counter/LFSR 20 in a shift right mode, and FIG. 4 illustrates the counter/LFSR 20 in a shift left mode. As can be seen in FIG. 3 and FIG. 4, the counter/LFSR 20 operates in similar manner in the shift right mode and shift left mode, except that the shifting direction is reversed so as to allow for data pattern generating and sequencing in a "forward" direction or a "backward" direction, as will be discussed in further detail hereinafter.

At the outset of a test, the start register 18 responds to a load control signal by loading the seed data pattern into a latch 24. The latch 24 has a plurality of data storage cells 25 each of which is capable of storing, for example, a single bit of information. In the case of address generation, it is preferable that each address of the DUT be accessible during testing and, thus, the latch 24 is preferably of a cell or bit size adequate for storing the longest address of the DUT. For example, a DUT having $2^{32}$ addresses would require the latch 24 to be at least 32 bits long, i.e., the latch would have to include at least 32 data storage cells 25. Note that if the latch 24 is longer than required for a particular test, then the configuration data would indicate data pattern width by specifying which bit(s) should be utilized during a test.

As described hereinabove, the seed data pattern is then passed in parallel to each of the prechannel multiplexers 22 for further manipulation. Generated data patterns are then sequentially developed by the counter/LFSR 20, beginning from the seed data pattern.

More specifically, in response to an execute control signal, the data pattern, seed or generated, stored in the latch 24 is gated through a feedback multiplexer 26 for selecting a feedback bit. The configuration register 16 provides the feedback multiplexer 26 with feedback selection data so that the feedback multiplexer 26 can select which bit of the data stored in the latch 24 should be used as the feedback bit for feeding back and carrying out the operations of the counter/LFSR 20. For example, in accordance with the DUT, the width of the data pattern to be used for testing can be specified so that the most significant bit of the data pattern can be selected as the feedback bit.

The feedback multiplexer 26 feeds back the feedback bit via AND gates 28. The AND gates 28 also receive configuration data, specifying feedback path, from the configuration register 16. This configuration data effectively controls the feedback arrangement of the counter/LFSR 20. Particularly, this configuration data defines and controls which bit(s) of the latch 24 will be shifted and inverted by an active feedback bit during the feedback shift operation. In this regard, each AND gate 28 performs an "AND" operation using the feedback bit and the configuration data received from the configuration register 16, so that there will only be an active output from the AND gate 28 if both the feedback bit and the configuration data are active or high.

A plurality of EXCLUSIVE OR gates 30 each receive the output of a respective AND gate 28 and a bit from a data storage cell 25 of the latch 24, and implement what is in actuality a modulo 2 summation operation thereon. As shown, the result is then shifted to an adjacent cell of the latch 24, via the corresponding EXCLUSIVE OR gate 30. Thus, it can be realized that a bit stored in a data storage cell 25 will be shifted and inverted if the EXCLUSIVE OR gate 30 corresponding to that particular data storage cell 25 receives a high active output from its corresponding AND gate 28. However, a bit stored in a data storage cell 25 will be shifted without being altered, i.e., without being inverted, if the EXCLUSIVE OR gate 30 corresponding to that data storage cell 25 receives a low output from its corresponding AND gate 28.

Advantageously, since the configuration register 16 can be programmed with configuration data as desired, various feedback arrangements for the counter/LFSR 20 can be implemented for specific testing purposes. For example, the feedback arrangement can provide for pseudo-random data pattern generation. The data pattern sequence is referred to as pseudo-random since the seed data pattern and algorithm for data pattern generation or alteration are known so that each generated data pattern is predictable. Pseudo-random data pattern sequences simulate the randomness of actual memory use and may stimulate failures that may not be discovered by more regular testing sequences.

In one preferred embodiment, the feedback arrangement of the counter/LFSR 20 is programmed in accordance with a prime polynomial with primitive roots. Such polynomials have no roots in the field. "Field" in this context is a mathematical concept which, in this case, refers to the set of binary numbers 0 and 1 together with the operation of modulo 2 addition and multiplication. The prime polynomial with primitive roots feedback arrangement provides for a pseudo-random data pattern sequence in which every distinct data pattern, except for the all zeros data pattern, for a given seed data pattern of a certain width are generated before any one of the distinct data patterns of that certain width is repeated. See, generally, R. W. Hamming, CODING AND INFORMATION THEORY (Prentice-Hall, Inc. 1980) and U.S. Pat. No. 4,959,832. Moreover, it should be understood that it is well known that every width of data pattern has a prime polynomial with primitive roots corresponding thereto.

Generally, in order to execute a shift left operation in accordance with a prime polynomial with primitive roots, the feedback of the counter/LFSR 20 is arranged such that the most significant bit of the data pattern is used as the feedback bit, and the bits of the data pattern which receive feedback are dictated by the polynomial. Particularly, the term of the polynomial having the exponent of greatest value corresponds to the width of the data pattern, but this exponent of greatest value is disregarded for feedback arrangement purposes. The exponents of the remaining terms of the polynomial then correspond to the bits of the data pattern which receive feedback.

Figure 5:
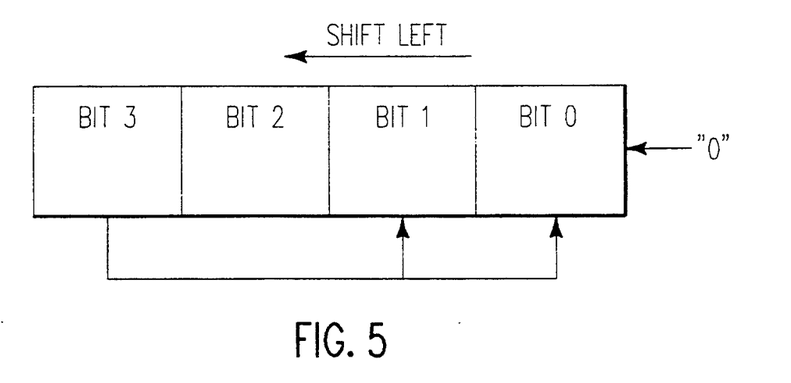
FIG. 5 illustrates a feedback arrangement used to implement a shift left operation in accordance with a prime polynomial with primitive roots for a four bit wide data pattern.

For example, assuming a four bit wide seed data pattern of 0001, FIG. 5 illustrates the feedback arrangement required for the counter/LFSR 20 to execute in a shift left mode in accordance with the prime polynomial with primitive roots as required for the four bit wide data pattern. Specifically, the required polynomial is as follows:

$$x^4+x^1+x^0$$

As shown, zeros are provided to the data pattern as required during the shift left operation. The term "$x^4$" has the exponent of greatest value, four, and corresponds to the four bit wide data pattern, but this term is disregarded for arranging feedback. The exponents of the remaining terms, "$x^1$" and "$x^0$", correspond to Bit 1 and Bit 0, respectively, and these bits are the bits of the data pattern which receive feedback.

Figure 6:
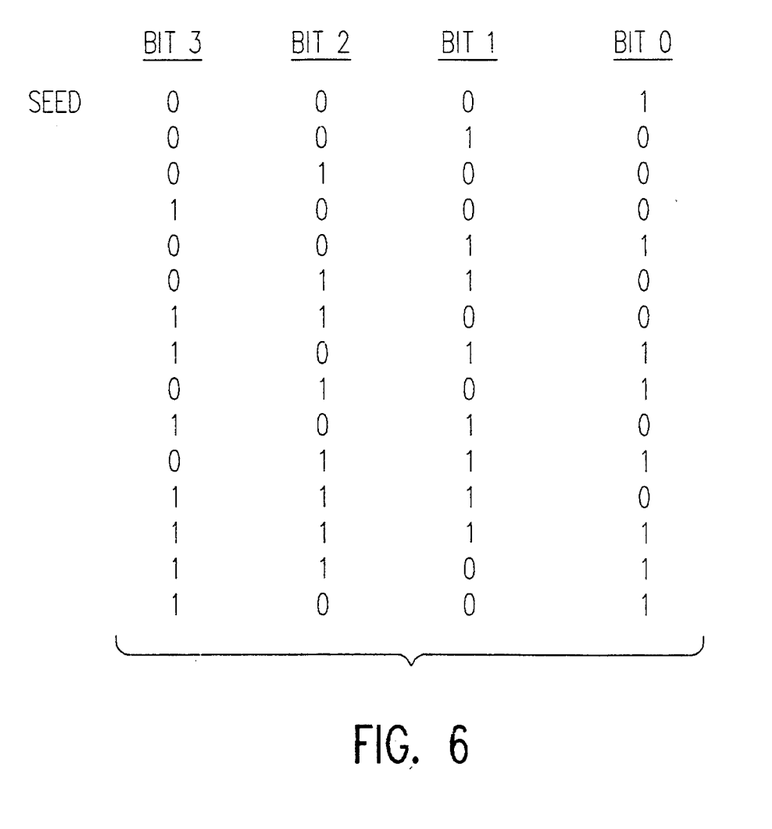
FIG. 6 illustrates a sequence of data patterns generated in accordance with the invention in a shift left mode.

FIG. 6 illustrates the generated data patterns developed by the counter/LFSR 20 programmed with such a seed data pattern and feedback arrangement. It can be seen that all distinct data patterns are generated for the four bit wide seed data pattern, except the all zeros data pattern, before repetition of any of the distinct data patterns (fifteen data patterns in total).

Moreover, it should be realized that the ability of the counter/LFSR 20 to algorithmically generate pseudo-random data pattern sequences, coupled with its ability to function in a shift left mode or a shift right mode which allows for generated data patterns to be sequenced in a "forward" direction and a "backward" direction, is highly desirable since it allows for pseudo-random march testing. In other words, all distinct data patterns of the seed data pattern can be generated, without repetition, in a "forward" pseudo-random data pattern sequence by operating in the shift left mode, and all distinct data patterns can also generated in a "backward" pseudo-random data pattern sequence, which is directly opposite from the "forward" pseudo-random data pattern sequence, by operating in the shift right mode. In this regard, it should be realized that it is an arbitrary designation to reference the shift left mode or the shift right mode as being the "forward" direction or the "backward" direction, and it is more important to understand that the data patterns can be generated in a known sequence and also generated in a reverse sequence relative to this known sequence for allowing pseudo-random march testing.

Generally, in order to execute a shift right operation in accordance with a prime polynomial with primitive roots, the feedback of the counter/LFSR 20 is arranged such that the least significant bit of the data pattern is used as the feedback bit, and the bits of the data pattern which receive feedback are dictated by the polynomial. Particularly, the term of the polynomial having the exponent of lowest value is disregarded for feedback arrangement purposes, and the bit(s) of the data pattern which receive feedback each correspond to the result of subtracting one, "1", from the exponent of each of the remaining terms of the polynomial.

Figure 7:
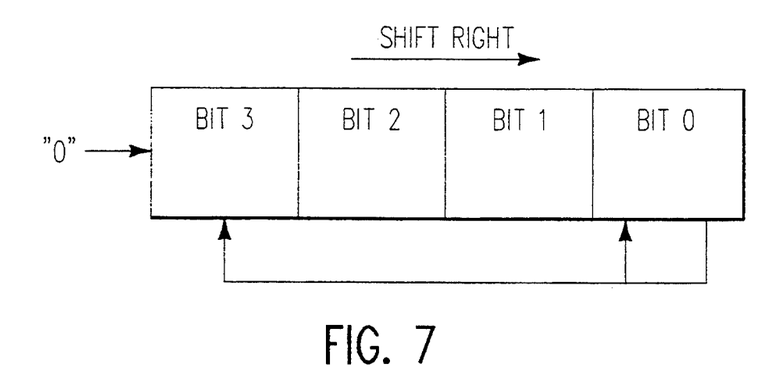
FIG. 7 illustrates a feedback arrangement used to implement a shift right operation in accordance with a prime polynomial with primitive roots for a four bit wide data pattern.
Figure 8:
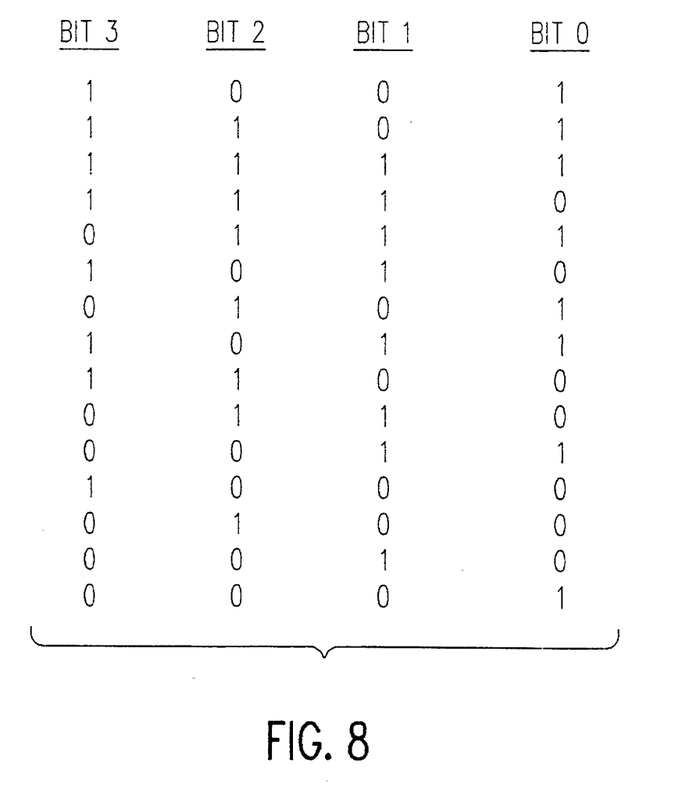
FIG. 8 illustrates a sequence of data patterns generated in accordance with the invention in a shift right mode.

Specifically, FIG. 7 illustrates the feedback arrangement required for the counter/LFSR 20 to execute in a shift right mode in accordance with the prime polynomial with primitive roots as set forth hereinabove. As shown, zeros are provided to the data pattern as required during the shift right operation. The least significant bit, Bit 0, is used as the feedback bit, and the term of the polynomial having the exponent of lowest value, "$x^0$", is disregarded for arranging feedback. Subtracting one, "1", from the exponent of each of the remaining terms, "$x^4$" and "$x^1$", results in Bit 3 and Bit 0 of the data pattern receiving feedback. FIG. 8 shows the generated data patterns developed by the counter/LFSR 20 programmed with such a feedback arrangement. Note that all distinct data patterns for the four bit wide data pattern are generated, without repetition, in the backward or reverse sequence relative to the sequence of data patterns shown in FIG. 6.

Figure 9A:
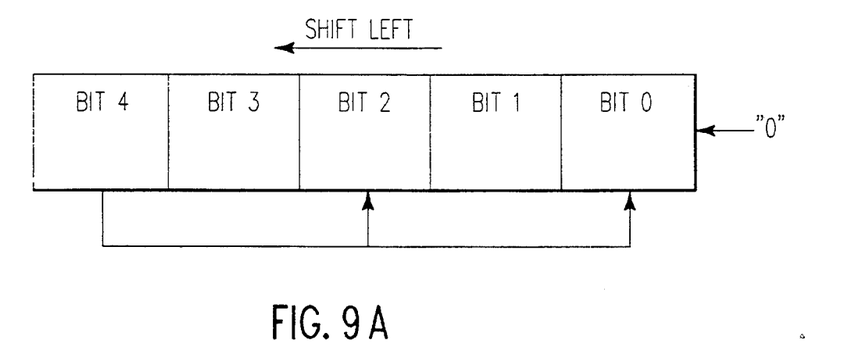
FIGS. 9(A)-(B) illustrate feedback arrangements to be used in accordance with a prime polynomial with primitive roots for a five bit wide data pattern.
Figure 9B:
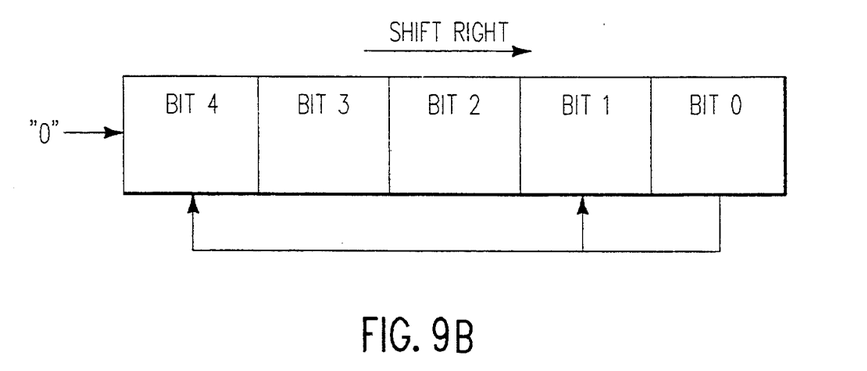

As another example, FIGS. 9(A)–(B) illustrate the feedback arrangements required to manipulate a five bit wide data pattern with the required prime polynomial with primitive roots, as follows:

$$x^5+x^2+x^0$$

FIG. 9(A) shows the feedback arrangement required for the shift left operation. The most significant bit, Bit 4, of the data pattern is used as the feedback bit and zeros are provided to the data pattern as required during the operation. As shown, feedback is received by the bits corresponding to the exponent of each of the remaining terms, "$x^2$" and "$x^0$"; specifically, Bit 2 and Bit 0 receive feedback.

FIG. 9(B) shows the feedback arrangement required for the shift right operation. The least significant bit, Bit 0, is used as the feedback bit, and the term of the polynomial having the exponent of lowest value, "$x^0$", is disregarded for arranging feedback. Subtracting one, "1", from the exponent of each of the remaining terms, "$x^5$" and "$x^2$", results in Bit 4 and Bit 1 of the data pattern receiving feedback.

Figure 10:
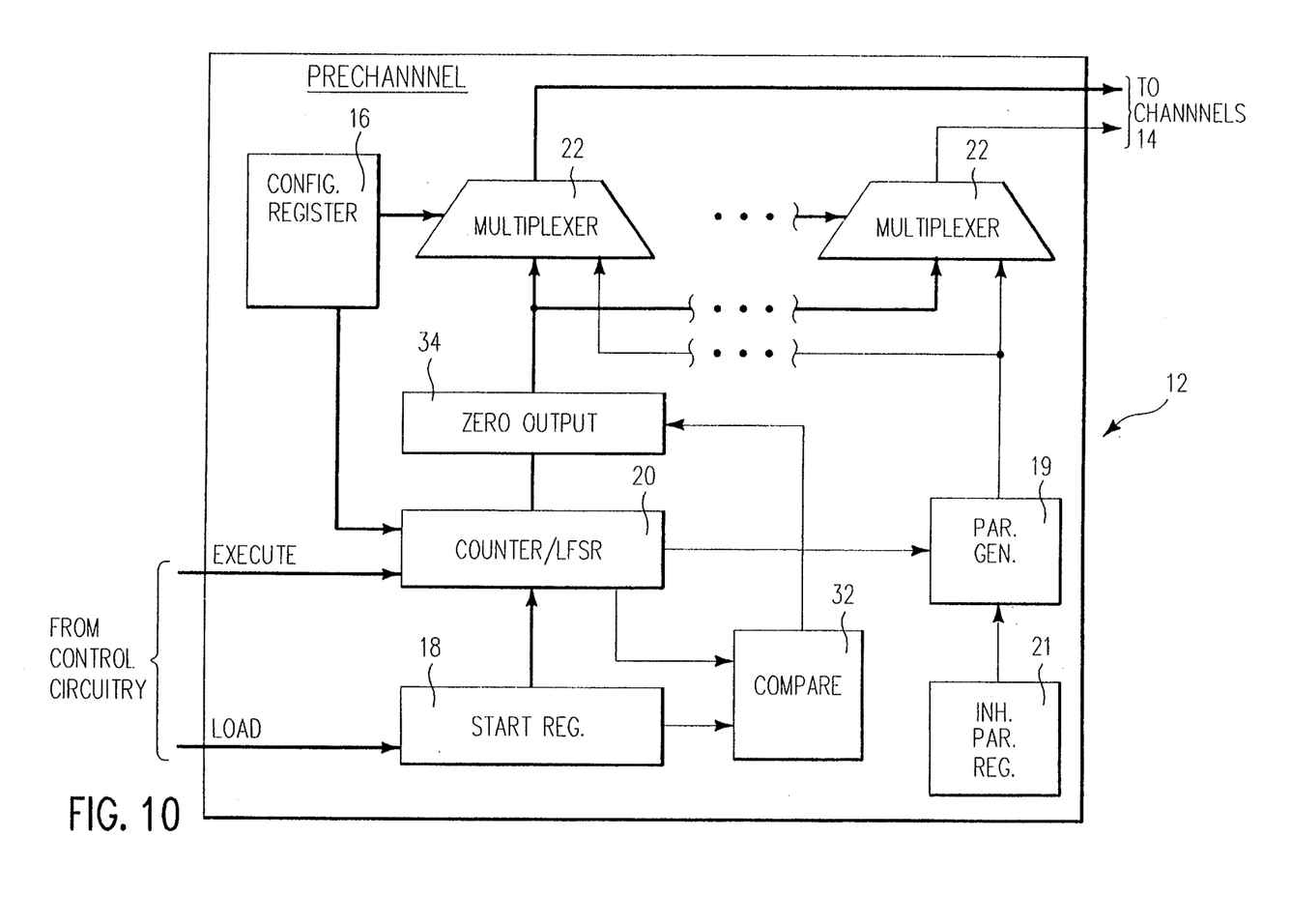
FIG. 10 is an electrical diagram illustrating the prechannel with circuitry allowing for an all zeros data pattern to be generated.

Additionally, FIG. 10 illustrates circuitry that can be employed to allow for generation of the all zeros data pattern. A comparator 32 is implemented to receive and compare the outputs of the start register 18 and counter/LFSR 20. When the comparator 32 determines that the generated data pattern developed by the counter/LFSR 20 is the same as the seed data pattern, then zero output circuitry 34 forces the generated data pattern in the counter/LFSR 20 to all zeros. Further, when an all zeros data pattern is generated, the control circuitry can be programmed to send the next load control signal to the start register 18 one cycle later. Thus, the zero data pattern can be generated without skipping any data patterns in the predetermined sequence.

When the counter/LFSR 20 functions as data rotating means, the configuration data stored in the configuration register 16 specifies to the prechannel multiplexers 22 which bit of the data pattern stored in the latch 24 should be selected as a feedback bit. This feedback bit would then be fed back through the AND gates 28, which function to specify the feedback path required for the rotation operation. The ouput of the AND gates 28 are then provided to the corresponding data storage cells 25 of the latch 24.

Furthermore, in accordance with the invention, a plurality of prechannels 12 and a plurality of channels 14 can each be in electrical communication with the same input pin of a DUT. For example, the testing system can be designed such that one prechannel 12 generates address data for testing a DRAM, while another prechannel 12 provides a count for the REFRESH requirements of the DRAM. Each prechannel 12 would provide data to a corresponding channel 14, and each channel 14 would connect to the same input pin of the DRAM.

Moreover, the invention can also be practiced with two or more channels 14, each being provided data by an independent prechannel 12, and each being multiplexed together so as to develop distinct test data sequences for an input pin of a DUT. Thus, it can be realized by those skilled in the electrical arts that the present invention provides for considerable flexibility in memory testing systems.

While the invention has been described in terms of specific embodiments, it is evident in view of the foregoing description that numerous alternatives, modifications and variations will be apparent to those skilled in the art. Thus, the invention is intended to encompass all such alternatives, modifications and variations which fall within the scope and spirit of the invention and the appended claims.

What is claimed is:

1. A system for providing test data for testing a semiconductor memory having a plurality of input pins, comprising: control means for supplying control signals; at least one prechannel for developing test data in a predetermined manner responsive to said control signals, each of said at least one prechannel comprising:

start means for providing a seed data pattern in response to one of said control signals; configuration means for providing a desired configuration;

generation means for successively developing generated data patterns, in response to another one of said control signals, beginning from said seed data pattern, such that every distinct data pattern of said seed data pattern is successively developed in a forward sequence without repetition of any distinct data pattern and, subsequently, said distinct data patterns are successively developed in a reverse sequence relative to said forward sequence; and selection means for successively selecting data from said seed data pattern and each of said generated data patterns, according to said desired configuration, for developing said test data; and a plurality of channels, each channel receiving test data from a corresponding one of said at least one prechannel, and each channel applying said test data to a corresponding one of said plurality of input pins;

wherein each of said at least one prechannel provides test data to at least two corresponding channels such that each of said at least one prechannel is in close proximity to the channels corresponding thereto.

2. A system according to claim 1, wherein said generation means comprises a linear feedback shift register.

3. A system according to claim 2, wherein said linear feedback shift register is programmed in accordance with a prime polynomial with primitive roots said prime polynomial with primitive roots comprising terms with exponents.

4. A system according to claim 3, wherein feedback of said linear feedback shift register for developing said generated data patterns in said forward sequence is dictated by the exponents of the terms of said prime polynomial with primitive roots, except for the exponent of greatest value, and feedback of said linear feedback shift register for developing said generated data patterns in said reverse sequence is dictated by the exponents of the terms of said prime polynomial with primitive roots, except for the exponent of lowest value.

5. A system according to claim 1, wherein said selection means comprises a multiplexer.

6. A system according to claim 1, further comprising means for generating parity of test data.

7. A system according to claim 1, wherein said at least one prechannel provides test data to eight channels.

* * * * *